(12) United States Patent
Babled et al.

(10) Patent No.: US 11,080,446 B2
(45) Date of Patent: Aug. 3, 2021

(54) METHOD TO REGULATE CLOCK FREQUENCIES OF HYBRID ELECTRONIC SYSTEMS

(71) Applicant: Synopsys, Inc., Mountain View, CA (US)

(72) Inventors: Cedric Babled, La Gaude (FR); Sylvain Bayon De Noyer, Tokyo (JP)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/823,014

(22) Filed: Mar. 18, 2020

(65) Prior Publication Data
US 2020/0302103 A1 Sep. 24, 2020

(30) Foreign Application Priority Data
Mar. 18, 2019 (EP) .................................. 19305320.4

(51) Int. Cl.
*G06F 30/00* (2020.01)
*G06F 30/3312* (2020.01)
*G06F 30/20* (2020.01)

(52) U.S. Cl.
CPC .......... *G06F 30/3312* (2020.01); *G06F 30/20* (2020.01)

(58) Field of Classification Search
CPC .............................. G06F 30/3312; G06F 30/20
See application file for complete search history.

(56) References Cited

U.S. PATENT DOCUMENTS

| | | | | |
|---|---|---|---|---|
| 5,841,967 A * | 11/1998 | Sample | ................. | G06F 30/331 714/33 |
| 6,754,763 B2 * | 6/2004 | Lin | ..................... | G06F 15/7864 710/317 |
| 7,970,597 B2 * | 6/2011 | Lin | ........................ | G06F 11/261 703/23 |
| 8,136,065 B2 * | 3/2012 | Huang | ................. | G06F 30/331 716/106 |
| 2002/0133325 A1 * | 9/2002 | Hoare, II | ................ | G06F 30/20 703/17 |
| 2004/0111252 A1 * | 6/2004 | Burgun | .......... | G01R 31/318357 703/28 |
| 2009/0083682 A1 * | 3/2009 | Akiba | ..................... | G06F 30/33 716/106 |

FOREIGN PATENT DOCUMENTS

JP 2010250365 A * 11/2010

* cited by examiner

*Primary Examiner* — Naum Levin
(74) *Attorney, Agent, or Firm* — Sterne, Kessler, Goldstein & Fox P.L.L.C.

(57) ABSTRACT

A hybrid electronic system including an emulator side including a processor and a first clock, a simulated side including one or more models to simulate one or more prototypes and a second clock, a first interface to the emulator side, and a second interface to the simulated side is disclosed. The processor is configured to determine using the first interface a first amount of time corresponding to an amount of time advanced on the emulator side by the first clock. The processor is configured to determine using the second interface a second amount of time corresponding to an amount of time advanced on the simulated side by the second clock, and set a value of a clock frequency of the second clock based on an initial value of the clock frequency of the second clock and a ratio of the first amount of time to the second amount of time.

20 Claims, 6 Drawing Sheets

METHOD TO REGULATE CLOCK FREQUENCIES OF HYBRID ELECTRONIC SYSTEMS

CROSS-REFERENCE TO RELATED APPLICATIONS

The present application claims the benefit under 35 U.S.C. § 119(a) of European Patent Application No. 19305320.4 filed on Mar. 18, 2019, which is incorporated herein by reference in its entirety for all purposes.

TECHNICAL FIELD

This disclosure has significance in the field of electronic design automation and/or electronic design simulation in general, including the following topics: a method to regulate clock frequencies in a hybrid electronic system automatically to eliminate timing deviations when each part of the hybrid electronic system executes freely, in particular.

BACKGROUND

A hybrid simulation allows splitting of an electronic design on at least two platforms of different types and speeds, connected and interacting together. For example, in a hybrid simulation system, there is an emulator platform (ZeBu) and a simulated platform on a host workstation, such as a virtualizer's simulator. The emulator platform and the simulated platform operate at different operating clock frequencies. In addition, the operating speed of these platforms vary during the execution time according to various external factors, including but not limited to, a load of activities in the simulated platform, amount of tracing on the design, etc.

For the hybrid electronic system, the best overall speed is achieved in a free-running execution mode. In the free-running execution mode, different platforms run independently at their respective maximum speeds. However, the free-running execution mode lacks any synchronization mechanism, which leads to significant timing deviations between different platforms and error conditions in the simulated platform.

As an example of the above-described scenario, a system component in the simulated platform side is requesting a job to be performed within a fixed timeout, e.g., software, executing on a simulated processor model in a virtualizer's simulator on the host is requesting the rendering of a graphics frame within a fixed 20 milliseconds (ms) timeframe. The rendering of the graphics frame is performed by another system component on the emulated side, for example, a graphics processor unit (GPU), mapped inside the emulator, i.e., ZeBu. The emulator side is slow compared to the simulated side. Therefore, the time has advanced much more in the simulated side of the platform compared to the emulator side of the platform causing timeout on the simulated side of the platform while the emulator side of the platform has not yet completed the assigned task. Due to the timeout on the simulated side, the software may take actions such as canceling the task, emitting an error, and/or restarting the simulator platform.

DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to regulating clock frequencies of a hybrid electronic system. In various aspects of the present disclosure, a mechanism is described to adjust the clock frequency dynamically that controls the time on a simulated side of the platform, i.e., the hybrid electronic system. The clock frequency is adjusted based on a speed ratio between an emulator side of the platform and the simulated side of the platform. The emulator side of the platform is slower compared to the simulated side of the platform. In various aspects, frequencies of other clocks executing or simulating remain unaffected, i.e., other clocks that do not control time on the simulated side of the platform are not regulated.

In the hybrid electronic system, each side, i.e., the simulated side and the emulator side, maybe is executing at its maximum speed. The maximum speed at which each side may be executing does not remain constant, but rather fluctuates during the execution due to several factors. By way of a non-limiting example, the factors causing fluctuations in the operating speeds of the emulator side of the platform and the simulated side of the platform may be central processing unit (CPU) load, amount of tracing enabled, the transmission of information to other components using an interface, etc. Accordingly, a ratio of clock frequency between the emulator side of the platform and the simulated side of the platform may not remain constant over time, but rather the ratio needs to recalculated frequently, for example, every 10000 ticks or seconds, during the execution of the hybrid system.

Figure 1:
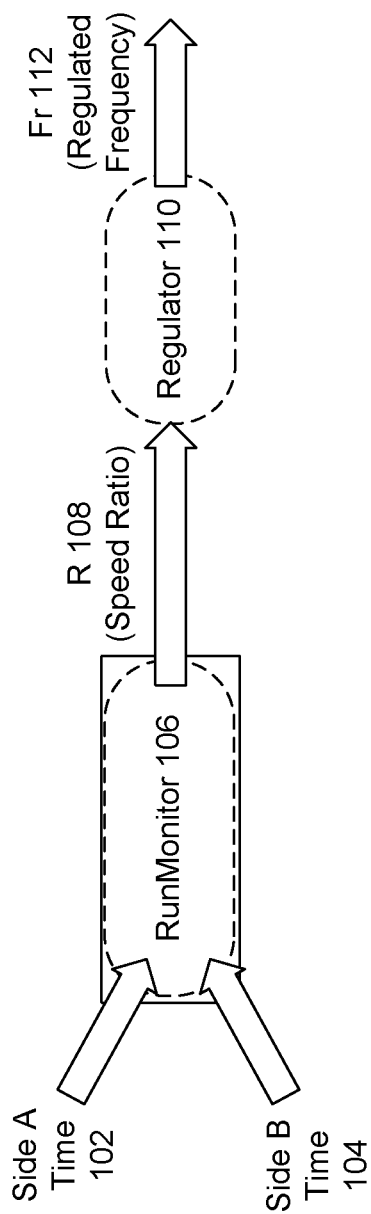
FIG. 1 illustrates a basic mechanism of operation in accordance with some aspects of the present disclosure.

FIG. 1 illustrates a basic mechanism of operation in accordance with some aspects of the present disclosure. As shown in FIG. 1, an example function such as a RunMonitor 106 takes as its input Side A Time 102 and Side B Time 104. The Side A Time 102 may correspond to a clock frequency on the emulator side of the platform, while the Side B Time 104 may correspond to a clock frequency on the simulated side of the platform. The Side A Time 102 and the Side B Time 104 may be measured during the execution of the hybrid electronic system and provided to the RunMonitor 106 for processing. The RunMonitor 106 then may generate a ratio R 108 as a speed ratio between the emulated side of the platform and the simulated side of the platform. The ratio R 108 may then be used as an input by the regulator 110 to adjust the clock frequency on the simulated side of the platform using the equation $Fr=Fv/f(R)$, where $Fr$ represents frequency of the regulated clock, i.e., frequency of the clock on the simulated side of the platform, Fv represents initial frequency of the clock, R represents speed ratio between the emulated side of the platform and the simulated side of the platform, and $f( )$ is a function transforming the platform execution speed ratio to a clock ratio. The function $f( )$ takes R as an input among another platform-specific constant or parameters, for example, the amount of tracing enabled, CPU load, etc., and calculates a regulated ratio as an output. The calculated ratio may be an integer number; as such, the value of the calculated ratio may not be less than 1. In some aspects, by way of a non-limiting example, the regulator 110 function may be implemented as a delay function to regulate the clock frequency on the simulated side of the platform.

In some aspects, the above-described equation may be represented using time period, which is inversely proportional to the clock frequency, as $Pr=Pv \times f(R)$, where Pr represents period of the regulated clock, Pv represents initial period of the regulated clock, R represents speed ratio between the emulator side of the platform and the simulator side of the platform, and $f( )$ represents a function transforming the platform execution speed ratio to a clock ratio. The function $f( )$ takes as its input the ratio R among other platform-specific constants/parameters and generates a regulated ratio as an output.

In the above-mentioned equation, Fv remains constant since Fv represents an initial frequency of the clock, which may be preconfigured by the operator of the hybrid electronic system. Ratio R 108 does not remain constant. Accordingly, ratio R 108 may be updated frequently during the execution of the hybrid electronic system. By way of a non-limiting example, the ratio R 108 may be updated every 10000 ticks or seconds. Accordingly, every time a new ratio R 108 is determined, a new value of Fr may be calculated.

When the hybrid electronic system is executing, the Side A Time 102 and the Side B Time 104 are increasing at their own uncorrelated pace. In some aspects, the emulator side of the platform (Side A) and the simulated side of the platform (Side B) each has an application programming interface via which the RunMonitor 106 function can get the local time information. The RunMonitor 106 function may calculate the local time difference between two consecutive samples via the application programming interface as T_interval=T_new−T_previous. Accordingly, the ratio R 108 may be calculated as R=T_(interval_side_A)/T (interval_side_B). Due to elevated variability of the speed on each side, the ratio R may change dynamically each time a new measurement is performed of the local time difference on the emulated and simulated platform side. The calculated ratio R 108 then may be used by a Regulator function 110 to calculate the regulated frequency Fr 112.

Figure 2:
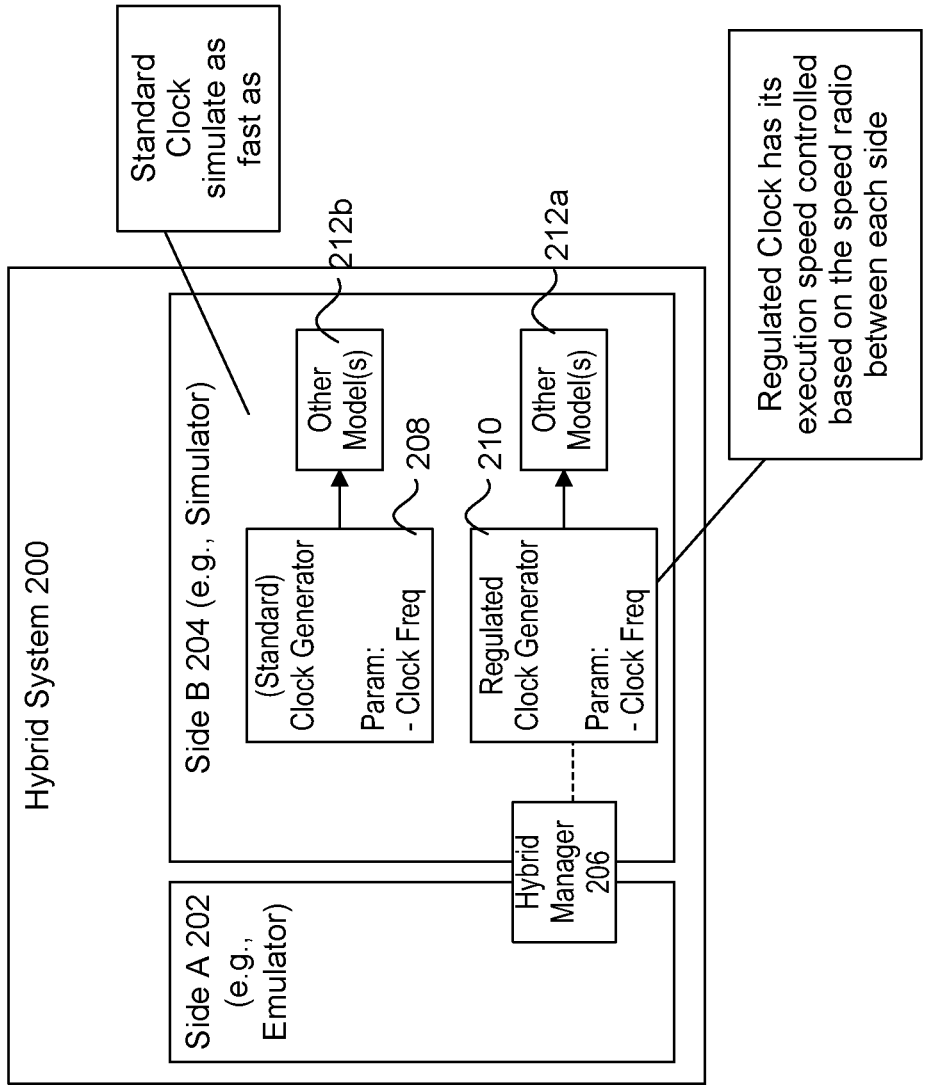
FIG. 2 illustrates a hybrid system from a user viewpoint in accordance with some aspects of the present disclosure.

FIG. 2 illustrates a hybrid system from a user viewpoint in accordance with some aspects of the present disclosure. As shown in FIG. 2, a hybrid system 200 may include side A 202 that may be an emulator, for example, such as ZeBu emulator, and side B 204 that may be a simulated side. The side B 204 may include a clock generator 210 that may be regulated by a hybrid manager 206. The side B 204 may also include another clock generator 208, which is not being regulated by the hybrid manager 206. The hybrid manager 206 may perform as the RunMonitor function 106. The side B 204 may also include other models, for example, 212a and 212b, which simulate various models, such as models for new gate design, a new integrated circuit design, a field-programmable gate array, etc. Accordingly, a hybrid system 200 may be set up by instantiating one or more models 212a and 212b in the simulator 204, and running clock generators 208 and 210 to drive the one or more models 212a and 212b's execution, and using hybrid technologies to make links between the emulator 202 and the simulator 204, In some aspects, the only change required in the hybrid system 200 is to use the regulated clock generator 210 instead of the standard clock generator 208. No other connection or parameter needs to be changed. Particularly, the regulated clock generator 210 has the same parameter Fv that may be used to set the initial frequency of the regulated clock generator 210. The hybrid manager 206 may execute the RunMonitor function 106, and the regulated clock generator 210 may execute the Regulator function 110.

In some aspects, the hybrid system 200 may have the functionality implemented in two different blocks; for example, the emulator 202 side and the simulated 204 side may be an implementation-specific decision. Accordingly, the emulator 202 side and the simulated 204 side may be implemented in a single block.

In some aspects, the hybrid system may have more than one execution platform connected and co-executing. For each side, i.e., the emulator and the simulator sides, the hybrid platform may include hardware-based execution platform, for example, Emulator/Zebu, or field-programmable gate array (FPGA) prototype or hardware (HW) prototype, etc., and simulator platform may include, for example, a virtualizer, a virtual circuit switch (VCS), etc. In some aspects, the emulator side of the platform may be a real device, hardware-based, or simulated, while the simulator side of the platform may be hardware-based or simulated.

Figure 3:
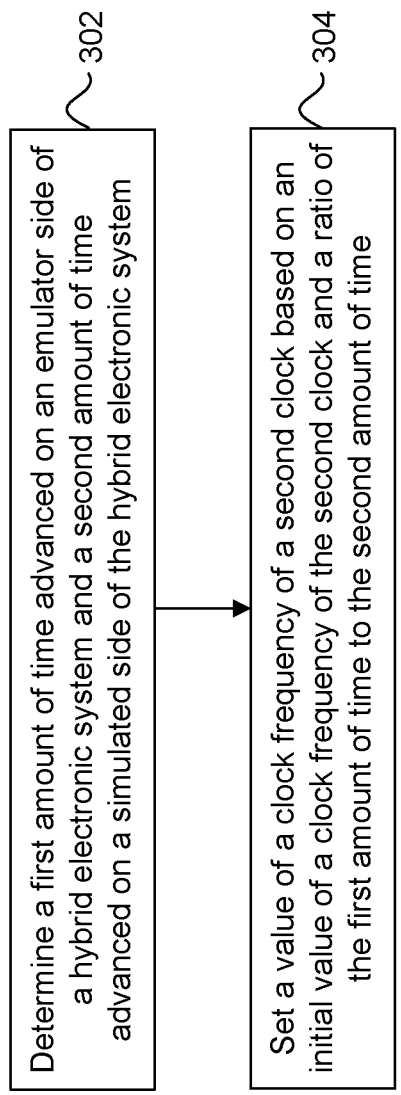
FIG. 3 illustrates a flowchart describing method steps in accordance with some aspects of the present disclosure.

FIG. 3 illustrates a flowchart describing method steps in accordance with some aspects of the present disclosure. The method begins at step 302, at which, a first amount of time advanced on the emulator side 202 of a hybrid electronic system 200 and a second amount of time advanced on the simulated side 204 of the hybrid electronic system 200 may be determined by the RunMonitor 106 function of the hybrid manager 206. As described above, both the emulator side 202 and the simulated side 204 are advancing freely according to their clocks, the first amount of time advanced on the emulator side 202 and the second amount of time advanced on the simulated side 204 may be different from each other.

In some aspects, at step 304, a value of a clock frequency of the second clock 210 may be set based on an initial value of a clock frequency of the second clock 210 and a ratio R 108 of the first amount of time to the second amount of time, as described herein. Thereby, regulating the frequency of the regulated clock 210 such that time advanced on both the emulator side and the simulated side remains the same.

Figure 4:
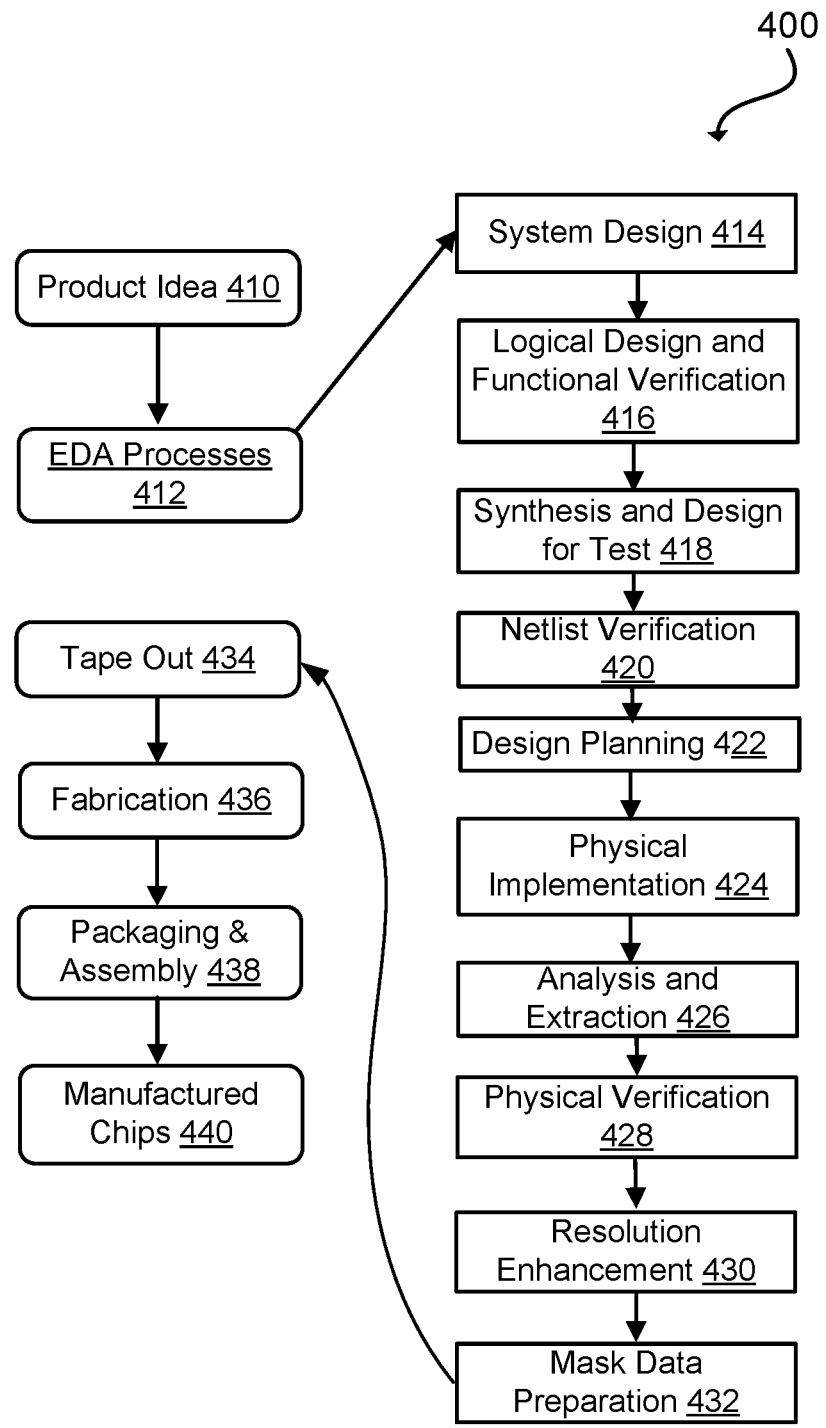
FIG. 4 illustrates a flow-chart of various processes used during the design and fabrication of an integrated circuit, according to an exemplary aspect of the present disclosure.

FIG. 4 illustrates an example set of processes 400 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 410 with information supplied by a designer, information that is transformed to create an article of manufacture that uses a set of EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die is fabricated 436, and packaging and assembly processes 438 are performed to produce the finished integrated circuit 440.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 4. The processes described by being enabled by EDA products (or tools).

During system design 414, the functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During the logic design and functional verification 416, modules or components in the circuit are specified in one or more description languages, and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 418, HDL code is transformed into a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist is checked for compliance with timing constraints and for correspondence with the HDL code. During design planning 422, an overall floor plan for the integrated circuit is constructed and analyzed for timing and top-level routing.

During layout or physical implementation 424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 426, the circuit function is verified at the layout level, which permits refinement of the layout design. During physical verification 428, the layout design is checked to ensure that manufacturing constraints are correct, such as DRC constraints, electrical constraints, lithographic constraints, and that circuitry function matches the HDL design specification. During resolution enhancement 430, the geometry of the layout is transformed to improve how the circuit design is manufactured.

During tape-out, data is created to be used (after lithographic enhancements are applied if appropriate) for the production of lithography masks. During mask data preparation 432, the 'tape-out' data is used to produce lithography masks that are used to produce finished integrated circuits.

A storage subsystem of a computer system (such as computer system 600 of FIG. 6, or host system 507 of FIG. 5) may be used to store the programs and data structures that are used by some or all of the EDA products described herein, and products used for development of cells for the library and for physical and logical design that use the library.

Figure 5:
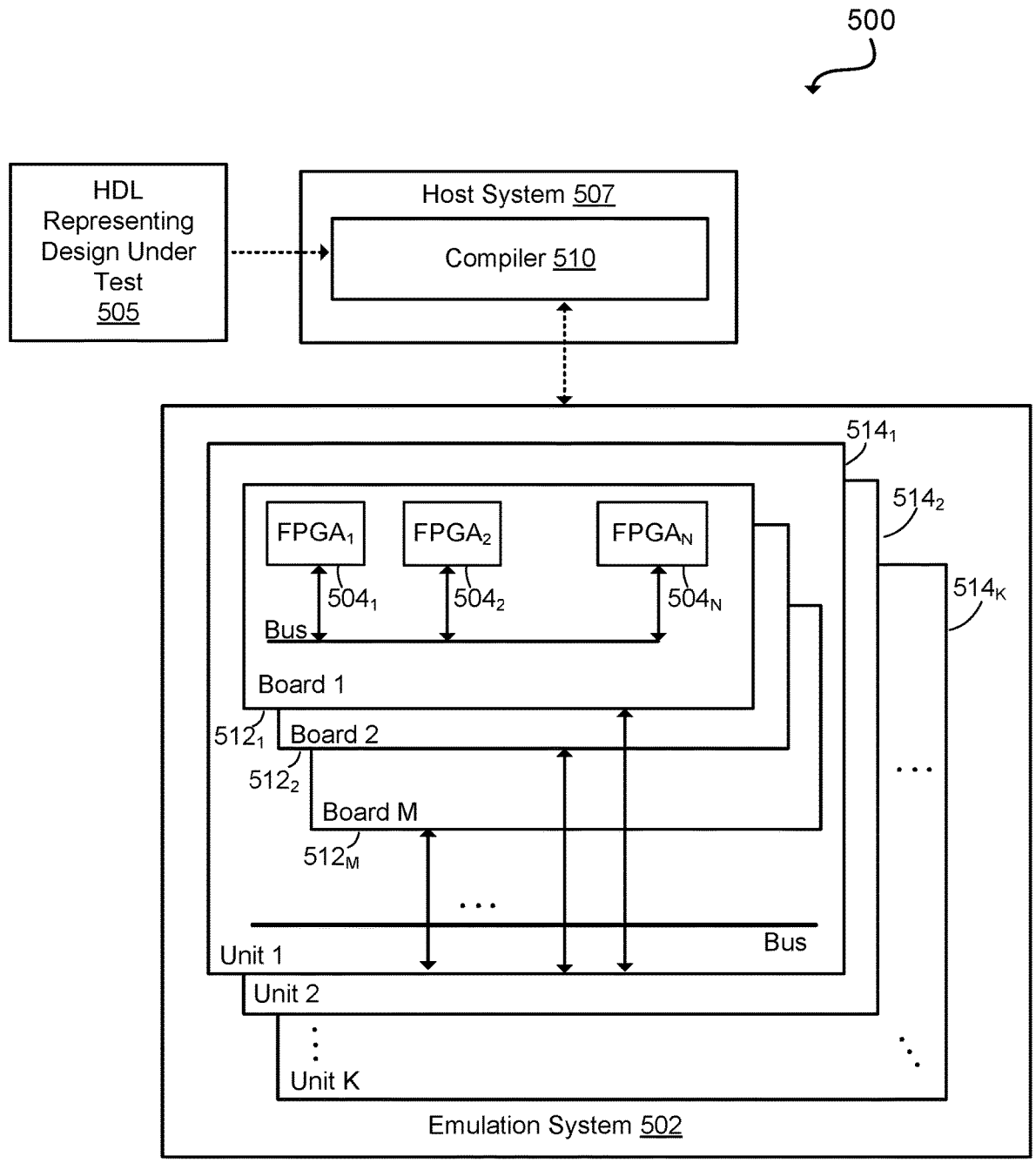
FIG. 5 illustrates an abstract diagram of an example emulation system in accordance with some aspects of the present disclosure.

FIG. 5 depicts an abstract diagram of an example emulation environment 500. An emulation environment 500 may be configured to verify the functionality of the circuit design. The emulation environment 500 may include a host system 507 (e.g., a computer that is part of an EDA system) and an emulation system 502 (e.g., a set of programmable devices such as Field Programmable Gate Arrays (FPGAs) or processors). The host system generates data and information by using a compiler 510 to structure the emulation system to emulate a circuit design. Circuit design to be emulated is also referred to as a Design Under Test ('DUT') where data and information from the emulation are used to verify the functionality of the DUT.

The host system 507 may include one or more processors. In the embodiment where the host system includes multiple processors, the functions described herein as being performed by the host system can be distributed among the multiple processors. The host system 507 may include a compiler 510 to transform specifications written in a description language that represents a DUT and to produce data (e.g., binary data) and information that is used to structure the emulation system 502 to emulate the DUT. The compiler 510 can transform, change, restructure, add new functions to, and/or control the timing of the DUT.

The host system 507 and emulation system 502 exchange data and information using signals carried by an emulation connection. The connection can be but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 507 and emulation system 502 can exchange data and information through a third device such as a network server.

The emulation system 502 includes multiple FPGAs (or other modules) such as FPGAs $504_1$ and $504_2$, as well as additional FPGAs to $504_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 502 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $504_1$-$504_N$ may be placed onto one or more boards $512_1$ and $512_2$ as well as additional boards through 512M. Multiple boards can be placed into an emulation unit $514_1$. The boards within an emulation unit can be connected using the backplane of the emulation unit or any other types of connections. In addition, multiple emulation units (e.g., $514_1$ and $514_2$ through $514_K$) can be connected to each other by cables or any other means to form a multi-emulation unit system.

For a DUT that is to be emulated, the host system 507 transmits one or more bit files to the emulation system 502. The bit files may specify a description of the DUT and may further specify partitions of the DUT created by the host system 507 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 507 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate-level netlist using the DUT description. A host system can use the netlist of the DUT to partition the DUT into multiple partitions, where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT, which includes interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In the case of multiple re-emulations of an FPGA, merging the results produces a full debug view.

The host system receives, from the emulation system, signals traced by the logic of the identified FPGAs during the re-emulation of the component. The host system stores the signals received from the emulator. The signals traced during the re-emulation can have a higher sampling rate than the sampling rate during the initial emulation. For example, in the initial emulation, a traced signal can include a saved state of the component every X milliseconds. However, in the re-emulation, the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterward, the circuit designer can request to re-emulate the same component for a different time period or to re-emulate another component.

A host system 507 and/or the compiler 510 may include subsystems such as, but not limited to, a design synthesizer sub-system, a mapping sub-system, a run time sub-system, a results sub-system, a debug sub-system, a waveform sub-system, and a storage sub-system. The sub-systems can be structured and enabled as an individual or multiple modules, or two or more may be structured as a module. Together these sub-systems structure the emulator and monitor the emulation results.

The design synthesizer sub-system transforms the HDL that is representing a DUT 505 into gate-level logic. For a DUT that is to be emulated, the design synthesizer sub-system receives a description of the DUT. If the description of the DUT is fully or partially in HDL (e.g., RTL or another level of abstraction), the design synthesizer sub-system synthesizes the HDL of the DUT to create a gate-level netlist with a description of the DUT in terms of gate-level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate-level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), a signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states, and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that is associated with the time period.

The debug sub-system transmits the retrieved interface signals to the emulator. The debug sub-system instructs the debug sub-system to use the identified FPGAs and for the trace and injection logic of each identified FPGA to inject its respective traced signals into the logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 6:
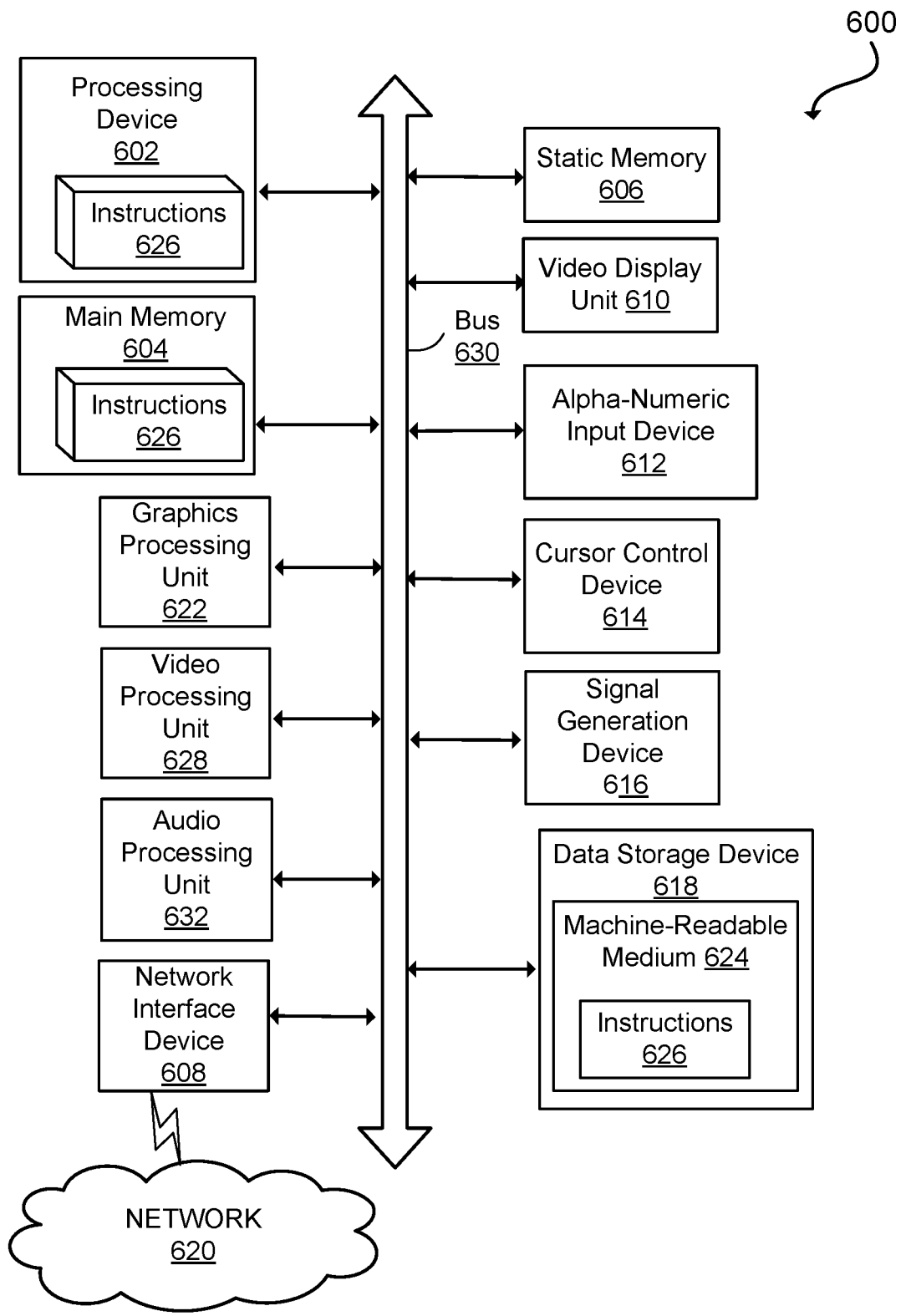
FIG. 6 illustrates an abstract diagram of an example computer system in which aspects of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in a client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

The processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 may also be one or more special-purpose processing devices such as an application-specific integrated circuit (ASIC), a field-programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604, and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to the desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer-readable storage medium, such as but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure, as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as read-only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures, and like elements are labeled with like numerals. The disclosure and drawings are, accordingly, to be regarded in an illustrative sense rather than a restrictive sense.

What is claimed:

1. A hybrid electronic system, comprising:
   an emulator side comprising:
      a processor; and
      a first clock;
   a simulated side comprising:
      one or more models to simulate one or more prototypes; and
      a second clock;
   a first interface to the emulator side; and
   a second interface to the simulated side,
   wherein the processor is configured to:
      determine, using the first interface, a first amount of time corresponding to an amount of time advanced on the emulator side by the first clock,
      determine, using the second interface, a second amount of time corresponding to an amount of time advanced on the simulated side by the second clock, wherein the first amount of time is different from the second amount of time, and
      set a value of a clock frequency of the second clock based on an initial value of the clock frequency of the second clock and a ratio of the first amount of time to the second amount of time.

2. The hybrid electronic system of claim 1, wherein the emulator side is hardware-based, a real device, or simulated in software.

3. The hybrid electronic system of claim 1, wherein the simulated side is hardware-based or simulated in software.

4. The hybrid electronic system of claim 1, wherein the processor is further configured to:
   probe the emulator side and the simulated side to determine local time information on the emulator side and the simulated side using the first interface and the second interface, respectively;
   compare the local time information on the emulator side with another local time information on the emulator side retrieved during another probe to determine the first amount of time; and
   compare the local time information on the simulated side with another local time information on the simulated side retrieved during the other probe to determine the second amount of time.

5. The hybrid electronic system of claim 4, wherein the probe and the other probe are performed at a preconfigured time period apart.

6. The hybrid electronic system of claim 5, wherein the preconfigured time period is up to 10000 ticks or seconds.

7. The hybrid electronic system of claim 1, wherein the processor is further configured to update the value of the clock frequency of the second clock at a preconfigured time interval.

8. A method, comprising:
   determining a first amount of time corresponding to an amount of time advanced on an emulator side of a hybrid electronic system by a first clock;
   determining a second amount of time corresponding to an amount of time advanced on a simulated side of the hybrid electronic system by a second clock, wherein the first amount of time is different from the second amount of time, wherein the first amount of time advanced on the emulator side corresponds to a frequency of the first clock, and wherein the second amount of time advanced on the simulated side corresponds to a frequency of the second clock; and
   setting a value of the frequency of the second clock based on an initial value of the frequency of the second clock and a ratio of the first amount of time to the second amount of time.

9. The method of claim 8, further comprising setting up the emulator side in hardware, a real device, or simulated in software.

10. The method of claim 8, further comprising setting up the simulated side on hardware or simulated in software.

11. The method of claim 8, further comprising:
    probing the emulator side and the simulated side to determine local time information on the emulator side and the simulated side;
    comparing the local time information on the emulator side with another local time information on the emulator side retrieved during another probing to determine the first amount of time; and
    comparing the local time information on the simulated side with another local time information on the simulated side retrieved during the other probing to determine the second amount of time.

12. The method of claim 11, further comprising the probing the emulator side and the simulated side after a preconfigured time period from the other probing.

13. The method of claim 12, wherein the preconfigured time period is up to 10000 ticks or seconds.

14. The method of claim 8, further comprising updating the value of the frequency of the second clock at a preconfigured time interval.

15. A non-transitory, tangible, computer-readable device having instructions stored thereon that, when executed by at least one computing device, cause the at least one computing device to perform operations comprising:

determining a first amount of time corresponding to an amount of time advanced on an emulator side of a hybrid electronic system by a first clock;

determining a second amount of time corresponding to an amount of time advanced on a simulated side of the hybrid electronic system by a second clock, wherein the first amount of time is different from the second amount of time, wherein the first amount of time advanced on the emulator side corresponds to a frequency of the first clock, and wherein the second amount of time advanced on the simulated side corresponds to a frequency of the second clock; and setting a value of the frequency of the second clock based on an initial value of the frequency of the second clock and a ratio of the first amount of time to the second amount of time.

16. The non-transitory, tangible, computer-readable device of claim 15, wherein the operations further comprise setting up the emulator side in hardware, a real device, or simulated in software, and setting up the simulated side in the hardware or simulated in the software.

17. The non-transitory, tangible, computer-readable device of claim 15, wherein the operations further comprise:

probing the emulator side and the simulated side to determine local time information on the emulator side and the simulated side;

comparing the local time information on the emulator side with another local time information on the emulator side retrieved during another probing to determine the first amount of time; and comparing the local time information on the simulated side with another local time information on the simulated side retrieved during the other probing to determine the second amount of time.

18. The non-transitory, tangible, computer-readable device of claim 15, wherein the operations further comprise the probing the emulator side and the simulated side after a preconfigured time period from the other probing.

19. The non-transitory, tangible, computer-readable device of claim 18, wherein the preconfigured time period is up to 10000 ticks or seconds.

20. The non-transitory, tangible, computer-readable device of claim 15, wherein the operations further comprise updating the value of the clock frequency of the second clock at a preconfigured time interval.

* * * * *